Sept. 5, 1972 L. L. JORDAN 3,689,357

GLASS-POLYSILICON DIELECTRIC ISOLATION

Filed Dec. 10, 1970

INVENTOR.
Larry Lee Jordan
BY
Robert J. Wallace
ATTORNEY

United States Patent Office 3,689,357

Patented Sept. 5, 1972

3,689,357

GLASS-POLYSILICON DIELECTRIC ISOLATION

Larry Lee Jordan, Kokomo, Ind., assignor to General Motors Corporation, Detroit, Mich.

Filed Dec. 10, 1970, Ser. No. 96,689
Int. Cl. C23f *1/02;* H01l *7/00*
U.S. Cl. 161—119 4 Claims

ABSTRACT OF THE DISCLOSURE

A composite substrate and method for making dielectrically isolated diffused semiconductor devices is disclosed. Islands of monocrystalline silicon are formed in one face of the substrate. The islands are nested in a thin polycrystalline silicon layer which is bonded to a lapped monocrystalline silicon wafer by an interjacent layer of glass. The glass has a high softening point temperature and thermal expansion properties similar to monocrystalline silicon.

BACKGROUND OF THE INVENTION

This invention relates to silicon semiconductor devices and more particularly to a substrate for making dielectrically isolated silicon semiconductor devices in an integrated circuit.

The various discrete semiconductor devices comprising a silicon monolithic integrated circuit frequently must be electrically isolated from one another. Various isolation techniques have been proposed. However, to be most commercially advantageous the isolation technique should be compatible with commercial production processing. Moreover, it should not significantly increase cost, particularly yield losses, for the overall processing, or decrease reliability of the finished product. Junction isolation meets these requirements and has been extensively used. However, because of its electrical limitations, interest has arisen in an alternate technique referred to as dielectric isolation.

Dielectric isolation is a technique by which the various discrete devices in a monolithic circuit are separated from one another by a surrounding dielectric medium. The dielectric isolation can be produced before or after the semiconductor devices are formed. However, the post-diffusion techniques require extensive special wafer handling and processing after device formation. This increases manufacturing cost and reduces yields in a later stage, after diffusion, of the overall processing. In addition, post-diffusion processing can deleteriously affect the reliability of the discrete semiconductor devices involved. Hence, this form of dielectric isolation has not been particularly attractive.

It has been recognized as more desirable to form the dielectric isolation pattern in the monolithic circuit wafer before the circuit devices are diffused into it. If there are any significant yield losses in forming the isolation, they will be in an early stage of wafer processing. Moreover, one does not risk affecting reliability of the discrete devices because they have not been formed yet. This can be done by making a composite wafer having discrete islands of monolithic semiconductor material embedded in a dielectric material. The various semiconductor devices are subsequently formed in the islands as one desires. The composite wafer must, then, be able to withstand diffusion conditions. It is well known to produce such a composite diffusion substrate by grooving a lapped monocrystalline silicon wafer, coating the grooves with dielectric, depositing a thick polycrystalline coating on the wafer over the grooves, and then lapping away the backside of the monocrystalline wafer to produce islands of monocrystalline material surrounded by polycrystalline material. This has been done in different ways, using both single and multiple deposits of polycrystalline material. However, each of these ways involves depositing a relatively thick polycrystalline layer, approximately 7–10 mils in thickness. Unfortunately, when the polycrystalline layer is deposited, it deposits on the edges and adjacent backside of the monocrystalline wafer, as well as on the desired face, forming a polycrystalline rim on the backside of the monocrystalline wafer. The rim is quite thick, compared to the coating, and even more irregular in thickness. Hence, one effectively loses a ready reference for parallelism to the grooved and coated surface. One must, of course, lap the wafer on the backside. However, it is essential that it be lapped substantially parallel with the front surface. If not, the dielectrically isolated islands revealed will be of varying thickness, or perhaps not revealed at all near one edge, and lapped completely through near an opposite edge. In addition, polycrystalline silicon expands differently from monocrystalline silicon, causing the composite wafers to bow. This further aggravates the problem in maintaining parallelism during lapping. Consequently this technique, while arousing considerable technical interest, has not achieved significant commercial success.

I have considered avoiding the rim and bow problem by forming grooves in the surface of the monolithic wafer, inverting it, fusing it with glass to another previously lapped monolithic wafer, and lapping the backside of the first wafer as usual. Unfortunately, I have not found a satisfactory glass for this purpose. All those having a sufficiently high softening point to withstand the subsequent diffusion temperatures also have a composition which contaminates the islands of monocrystalline silicon. All of the known glasses which might be suitable contain large amounts of boron and aluminum, which migrate into the semiconductor islands during diffusion. However, I have now found a technique by which I can use these glasses without encountering island contamination.

SUMMARY OF THE INVENTION

It is, therefore, an object of the invention to provide an improved composite substrate for making diffused dielectrically isolated semiconductor devices. It is also an object of the invention to provide an improved method for making dielectrically isolated islands of silicon on a substrate in which a plurality of semiconductor devices are to be formed. A still further object of the invention is to provide a means for obtaining more uniform thickness of the dielectricaly isolated islands in a composite diffusion substrate for silicon monolithic integrated circuits.

The objects of the invention are achieved by grooving a lapped monocrystalline silicon wafer, forming a thin dielectric coating on the grooved surface, depositing only a very thin polycrystalline silicon layer over the coated surface, and bonding the coated surface to a previously lapped monocrystalline silicon wafer by an interlayer of fused glass. The backside of the first wafer is then lapped parallel the grooved surface to reveal discrete islands of monocrystalline silicon. Unusually high degrees of surface parallelism can be realized, to produce an extremely uniform island thickness across the entire face of the wafer.

BRIEF DESCRIPTION OF THE DRAWING

These and other objects, features and advantages of the invention will be more clearly understood in connection with the following description of a preferred embodiment thereof and from the drawing, in which.

DESCRIPTION OF THE PREFERRED EMBODIMENTS

Figure 1:
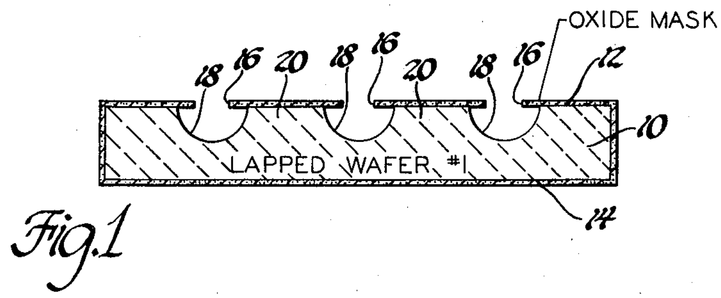
FIG. 1 is a sectional view showing a grooved monocrystalline silicon wafer in initial phases of processing.

FIG. 1 shows a monocrystalline silicon wafer 10 about 3 mils thick having a dense silicon dioxide coating thereon about 1.25 microns thick. The silicon dioxide coating is produced by oxidizing the wafer for about 3 hours at 1200° C. in moist air. Wafer 10 has been lapped to a predetermined surface smoothness and parallelism between its major faces 12 and 14. If a higher degree of surface parallelism is desired, the wafer can also be polished.

A grid pattern 16 is etched in the oxide using conventional photoresist techniques to form a mask. A pattern of interconnected grooves 18 is etched into the wafer surface 12 through the oxide mask to a depth of about 1½ mils. Islands 20, about 4 mils square and 1½ mils thick, are thus formed on surface 12. Groove depth and island size can be varied, as one desires, for particular applications. A mixture of 7½% HF in $HNO_3$ can be used to etch the grooves. The masking oxide is then removed by immersing the grooved wafer in HF for 2 minutes, after which it is rinsed and dried.

Figure 2:
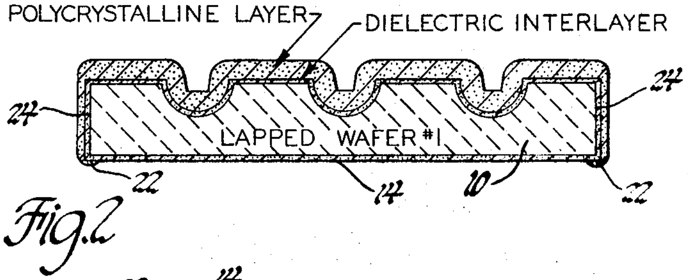
FIG. 2 is a cross-sectional view showing the wafer after after oxidation and deposition of a polycrystalline layer.

As can be seen in FIG. 2, a continuous dielectric layer is then deposited on the grooved wafer surface 12, including the grooves 18 as well as the tops of islands 20. The dielectric layer can be a dense silicon dioxide coating, about 2.5 microns thick, grown in 8 hours at 1200° C. in moist air. The dielectric layer serves in isolating the islands from each other and from a fusing glass which is subsequently applied. It also provides a surface which will nucleate polycrystalline silicon, which is to be deposited in the next following step.

If the dielectric layer is sufficiently dense, such as a thermally grown oxide, a thickness of only about 1–2 microns is preferred. At least about 1 micron is needed in most instances for satisfactory isolation. However, coatings of more than 3 microns are time consuming and costly to apply, without generally producing any improved results. However, as will subsequently be appreciated, thicker coatings may be desired in some instances as a diffusion barrier between the islands and the glass. Pyrolytic coatings of silicon dioxide can be formed in shorter times but they require subsequent treatment to densify them. Other dielectrics such as aluminum oxide and silicon nitride can be used for some applications but are not preferred.

After the dielectric layer has been formed on the wafer, a thin continuous polycrystalline silicon layer is deposited over it. To deposit the polycrystalline silicon, the wafer is placed on a susceptor plate in an epitaxial reactor chamber. The chamber is closed, evacuated, and backfilled with nitrogen. The wafers are then heated in flowing nitrogen to 1100° C. for 3 minutes to form nucleation sites on the silicon dioxide surface for polycrystalline silicon deposition. The nitrogen flow is discontinued and a 12 liter per minute hydrogen flow commenced through the chamber. The temperature is adjusted to 1135° C. and an additional flow of hydrogen and silicon tetrachloride started at 1 liter per minute. These conditions are maintained for about 30 minutes to obtain a polycrystalline layer, approximately 1 mil thick on the island surface and approximately 0.7 mil thick in the grooves.

As previously mentioned, polycrystalline silicon not only deposits on the wafer top surface 12 but also on the edges 22 of backside 14. If a polycrystalline deposit of about 10 mils is formed, a relatively thick rim will also concurrently form around the backside edges 22 of the wafer. However, if the polycrystalline layer is maintained less than about 2 mils thick, this rim will not form. At most, one can observe some unconnected nucleation sites starting to grow but which do not cause any significant problem in this invention. These sites are shown exaggerated in the drawing. Also, the polycrystalline layer is shown for illustration purposes to be continuous on the sides 24 of wafer 10. However, when the polycrystalline layer on surface 10 is only about 1 mil, the layer is frequently discontinuous on sides 24.

The polycrystalline silicon should at least be thick enough to obtain a continuous coating over the dielectric layer on surface 12. This is nominally about 1 mil. It should also be thick enough to allow for subsequently lapping down to this layer without lapping through it at any point. Coatings of 1½ mils may be preferred to provide a wider lapping tolerance. Coatings in excess of 2 mils tend to cause wafer bowing, as well as rim buildup on the backside edges 22 of the wafer.

Figure 3:
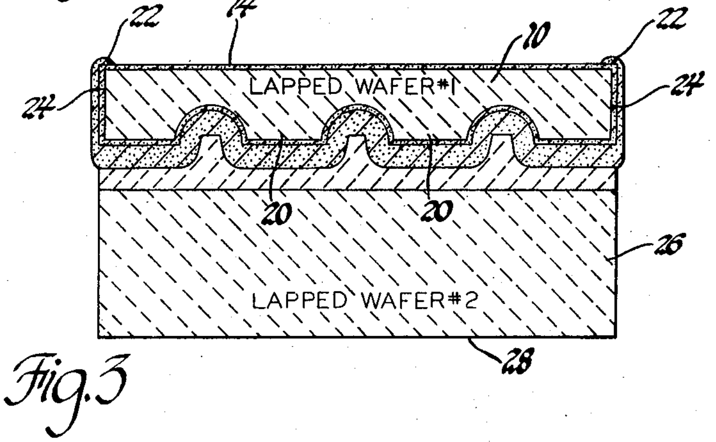
FIG. 3 is a sectional view showing the wafer after inversion and bonding to a second monocrystalline wafer.

Referring now to FIG. 3, a thin layer of fusing glass is then applied to the polycrystalline coated wafer, overfilling the grooves. The glass wafer is placed on a second lapped monocrystalline silicon wafer 26 with the glassed side down and bonded thereto by heating for 30 minutes in air at 1300° C. A small quartz weight placed on top of the stacked wafers during heating helps insure good bonding and parallelism between the two wafers.

The second wafer 26 serves as a support for the dielectrically isolated islands in the resultant diffusion substrate and is, therefore, thick enough, about 10 mils or so, to serve this purpose. The preferred thickness can be varied, therefore, as one desires. This wafer is preferably finished to at least as high a degree of parallelism as the starting wafer 10. Hence, it is generally at least lapped, and even polished if one desires a greater degree of parallelism. It is important that this supporting wafer 26 have thermal expansion characteristics similar to monocrystalline silicon.

Figure 4:
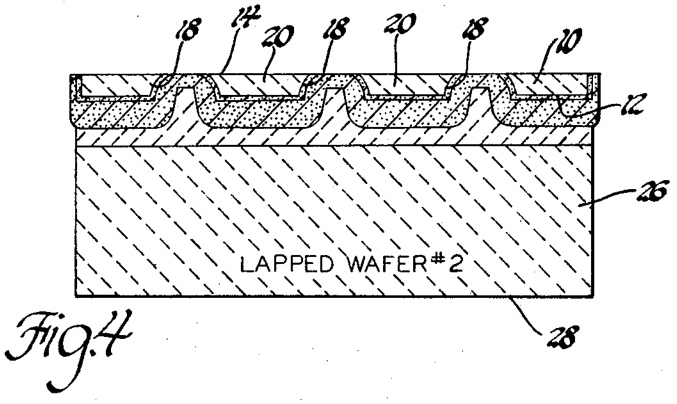
FIG. 4 is a sectional view showing the finished composite diffusion substrate.

After the two wafers are bonded together with the glass, the exposed face 28 of second wafer 26 can be mounted on a lapping block (not shown). Since all wafer major surfaces are parallel, mounting for lapping is conventional and constitutes no problem. The exposed face 14 of the first wafer is then lapped away in the usual manner until the polycrystalline layer in the grooves 18 shows through. The wafer surface is then polished to prepare it for device fabrication. The resultant product is shown in FIG. 4.

It is important that the lapping be discontinued before the polycrystalline layer in grooves 18 is lapped away. If the polycrystalline layer is lapped through, the underlying glass coating will be exposed on the surface of the diffusion substrate adjacent islands 20. It will contact the thermal oxide which is subsequently formed on this surface as a diffusion mask. The glass can mix with the thermal oxide, to allow rapid migration of impurities from the glass across the face of the substrate during diffusion, contaminating the adjacent island portions. Accordingly, sufficient polycrystalline silicon should be initially deposited to allow for the lapping tolerances of the equipment employed.

To insure maximum parallelism between wafers 10 and 26, it is preferred to employ only enough glass to fill the grooves 18 and provide a continuous coating on the islands 20. It is conveniently applied in paste form, in which fine glass particles are suspended in a suitable vehicle containing a temporary binder, screening aids and the like. A suitable paste comprises 59% glass powder, 38% diethylene glycol mono butyl ether, 1% ethylene cellulose, and 2% commercial screening aid. The glass powder used is preferably approximately 5 microns or less. The paste is screened onto the wafer surface with a squeegee through an 80 mesh screen. The glassed wafer is slowly dried and then heated for a few minutes at 1300° C. in air to fire the binder out of the glass. The wafer can then be cooled and assembled with the second wafer 26 for fusion together.

The glass which is to be used as a wafer binder should have thermal expansion properties similar to monolithic silicon and a softening point of at least about 1000° C. Otherwise, the islands 20 in the diffusion substrate shown in FIG. 4 may tend to drift during diffusion processing. On the other hand, the glass should have a working point below about 1400° C., if one expects to bond the two wafers together in a reasonable time at a temperature below the melting point of silicon. In general aluminosilicate and borosilicate glasses are useful. EE–5 available from Owens-Illinois can be used. Also, it appears that firing in air may tend to increase the softening and working point of the glass in the bonded diffusion substrate. Hence, I prefer to bond the wafers together in an air atmosphere to insure best dimensional stability in the diffusion substrate.

As previously mentioned, aluminosilicate and borosilicate glasses can contaminate the monocrystalline islands. A 2 micron silicon dioxide interlayer between the monolithic islands and the polycrystalline layer is an effective diffusion barrier for boron. However, it is not completely effective against aluminum, especially after extended diffusion processing. However, the extent of aluminum penetration is generally not a problem even with N-type islands unless extremely small island sizes are desired. Then perhaps one may wish to increase the dielectric thickness, use a different dielectric, use a borosilicate glass, or the like. For P-type islands, the aluminum diffusion can be used to provide a low resistance connection to the bottom of the monolithic island in the diffusion substrate. A low resistance connection to the bottom of an N-type island in the diffusion substrate can be obtained by making a blanket diffusion into the surface 12 of the starting wafer, after the grooves have been etched but before the dielectric interlayer has been formed. This will provide a continuous N+ coating on the sides and bottom of the islands in the diffusion substrate.

Scribing and breakout of the independent dies from the diffusion substrate after diffusion is accomplished in the normal and accepted manner by scribing the backside of the diffusion substrate.

I claim:

1. A composite silicon substrate in which dielectrically isolated semiconductor devices can be formed by diffusion techniques, said substrate comprising a lapped wafer of monocrystalline silicon, a layer of glass fused to one face of said wafer, said glass having thermal expansion properties similar to monocrystalline silicon and a softening point temperature not significantly less than the diffusion temperatures to which the substrate is to be subjected and below the melting point of silicon, a nonplanar layer of polycrystalline silicon on said glass layer with said glass fused to its contacting face, said polycrystalline silicon layer being from about 1–2 mils thick, a pattern of ridges and valleys on the opposite face of said nonplanar layer with said ridges forming a part of one face on said composite substrate, islands of monocrystalline silicon nested in said valleys and forming substantially the balance of said one face on said composite substrate, and a dielectric interlayer between each island and said polycrystalline layer.

2. A composite silicon substrate in which dielectrically isolated semiconductor devices can be formed by diffusion techniques, said substrate comprising a lapped wafer of monocrystalline silicon, a layer of glass fused to one face of said wafer, said glass having thermal expansion properties similar to monocrystalline silicon and a softening point temperature above about 1000° C. and a working point temperature below about 1400° C., a waffle-like layer of polycrystalline silicon on said glass layer with said glass fused to its contacting face, said polycrystalline silicon layer being about 1–2 mils thick, a pattern of ridges and valleys on the opposite face of said polycrystalline silicon layer with said ridges forming a part of one face on said composite substrate, islands of monocrystalline silicon on said face nested in said valleys and forming substantially the balance of said one face on said composite substrate, and a thermally formed silicon dioxide dielectric interlayer between each island and said polycrystalline layer.

3. The method of making a composite substrate in which a plurality of dielectrically isolated diffused semiconductor devices can be formed, said method comprising the steps of:

lapping a first wafer of monocrystalline silicon to a predetermined degree of surface parallelism, etching a pattern of interconnected grooves into one face of said wafer to form a plurality of discrete island portions thereon, coating the grooved surface with a continuous dielectric layer about 1–3 microns thick, depositing on said dielectric layer a continuous layer of polycrystalline silicon about 1–2 mils thick, lapping a second wafer to a predetermined degree of surface parallelism, bonding the grooved and coated face of said first wafer to one face of said second wafer with a glass to form a composite assembly of parallel wafers, said glass having thermal expansion properties similar to monocrystalline silicon and a softening point temperature of at least 1000° C., and lapping the exposed face of said first wafer in said assembly to expose the polycrystalline silicon layer in the grooves in its said one face, and thereby reveal dielectrically isolated islands of monocrystalline silicon.

4. The method of making a composite substrate in which a plurality of dielectrically isolated diffused semiconductor devices can be formed, said method comprising the steps of:

lapping a first wafer of monocrystalline silicon to a predetermined degree of surface parallelism, etching a pattern of interconnected grooves into one face of said wafer to form a plurality of discrete island portions thereon, oxidizng said wafer to coat said one surface with a dense continuous layer of silicon dioxide about 1–3 microns thick, depositing on said silicon dioxide layer a continuous layer of polycrystalline silicon about 1–2 mils thick, applying a continuous powdered glass coating to said polycrystalline silicon layer with said coating being less than 1 mil thick over said island portions, said glass having a softening point temperature of at least about 1000° C. and a working point temperature below about 1400° C., lapping a second wafer of monocrystalline silicon to a predetermined degree of surface parallelism, pressing the glass coated surface of said first wafer against one surface of said second wafer, heating the wafers to a temperature of about 1000° C–1400° C. to bond said wafers together and form a composite wafer assembly with closely parallel exposed faces, cooling the assembly and mounting the exposed face of said second wafer on an appropriate support, and lapping the exposed face of said first wafer to reduce its thickness and reveal a plurality of dielectrically isolated islands of monocrystalline silicon separated by channels of polycrystalline silicon.

References Cited

UNITED STATES PATENTS

| | | | |
|---|---|---|---|
| 3,391,023 | 7/1968 | Frescura | 156—17 X |
| 3,433,686 | 3/1969 | Marinace | 29—589 X |
| 3,559,283 | 2/1971 | Kravitz | 29—583 X |
| 3,623,219 | 11/1971 | Stoller et al. | 156—17 X |

WILLIAM A. POWELL, Primary Examiner

U.S. Cl. X.R.

29—583; 117—212, 215; 156—3, 8, 17